(12) United States Patent
Sun et al.

(10) Patent No.: US 8,133,659 B2
(45) Date of Patent: Mar. 13, 2012

(54) ON-TRACK PROCESS FOR PATTERNING HARDMASK BY MULTIPLE DARK FIELD EXPOSURES

(75) Inventors: Sam X. Sun, Rolla, MO (US); Hao Xu, Rolla, MO (US); Tony D. Flaim, St. James, MO (US)

(73) Assignee: Brewer Science Inc., Rolla, MO (US)

( * ) Notice: Subject to any disclaimer, the term of this patent is extended or adjusted under 35 U.S.C. 154(b) by 382 days.

(21) Appl. No.: 12/362,268

(22) Filed: Jan. 29, 2009

(65) Prior Publication Data

US 2009/0191474 A1  Jul. 30, 2009

Related U.S. Application Data

(60) Provisional application No. 61/024,474, filed on Jan. 29, 2008.

(51) Int. Cl.
*G03F 7/20* (2006.01)
*G03F 7/22* (2006.01)
*G03F 7/30* (2006.01)
*G03F 7/36* (2006.01)

(52) U.S. Cl. ........ 430/311; 430/312; 430/313; 430/317; 430/318; 430/323; 430/325; 430/326; 430/327; 430/329; 430/330

(58) Field of Classification Search .................. None
See application file for complete search history.

(56) References Cited

U.S. PATENT DOCUMENTS

| | | | |
|---|---|---|---|
| 3,345,210 A | 10/1967 | Wilson | |
| 3,561,962 A | 2/1971 | Ewing | |
| 3,615,615 A | 10/1971 | Lincoln et al. | |
| 3,629,036 A | 12/1971 | Isaacson | |
| 3,682,641 A | 8/1972 | Casler et al. | |
| 3,833,374 A | 9/1974 | Patrick | |
| 3,856,751 A | 12/1974 | Wilson | |
| 3,873,361 A | 3/1975 | Franco et al. | |
| 3,894,163 A | 7/1975 | Broyde | |
| 3,976,524 A | 8/1976 | Feng | |
| 4,137,365 A | 1/1979 | Wydeved et al. | |
| 4,175,175 A | 11/1979 | Johnson et al. | |
| 4,244,798 A | 1/1981 | Gold et al. | |
| 4,320,224 A | 3/1982 | Rose et al. | |
| 4,346,163 A | 8/1982 | Takeyama et al. | |

(Continued)

FOREIGN PATENT DOCUMENTS

EP   1 033 624   6/2000

(Continued)

OTHER PUBLICATIONS

Office action dated Mar. 3, 2010 in related case U.S. Appl. No. 11/839,317, filed Aug. 15, 2007.

(Continued)

*Primary Examiner* — Sin J. Lee

(74) *Attorney, Agent, or Firm* — Hovey Williams LLP

(57) ABSTRACT

This invention provides methods of creating via or trench structures on a developer-soluble hardmask layer using a multiple exposure-development process. The hardmask layer is patterned while the imaging layer is developed. After the imaging layer is stripped using organic solvents, the same hardmask can be further patterned using subsequent exposure-development processes. Eventually, the pattern can be transferred to the substrate using an etching process.

14 Claims, 8 Drawing Sheets

U.S. PATENT DOCUMENTS

| | | | |
|---|---|---|---|
| 4,369,090 A | 1/1983 | Wilson et al. |
| 4,397,722 A | 8/1983 | Haller |
| 4,430,419 A | 2/1984 | Harada |
| 4,526,856 A | 7/1985 | Lewis et al. |
| 4,568,631 A | 2/1986 | Badami et al. |
| 4,578,328 A | 3/1986 | Kray |
| 4,647,517 A | 3/1987 | Hersener et al. |
| 4,683,024 A | 7/1987 | Miller et al. |
| 4,732,841 A | 3/1988 | Radigan |
| 4,738,916 A | 4/1988 | Namatsu et al. |
| 4,742,152 A | 5/1988 | Scola |
| 4,803,147 A | 2/1989 | Mueller et al. |
| 4,808,513 A | 2/1989 | Lazarus et al. |
| 4,845,265 A | 7/1989 | Lapin et al. |
| 4,891,303 A | 1/1990 | Garza et al. |
| 4,910,122 A | 3/1990 | Arnold et al. |
| 4,927,736 A | 5/1990 | Mueller et al. |
| 4,996,247 A | 2/1991 | Nelson et al. |
| 5,057,399 A | 10/1991 | Flaim et al. |
| 5,066,566 A | 11/1991 | Novembre |
| 5,089,593 A | 2/1992 | Fjare et al. |
| 5,091,047 A | 2/1992 | Cleeves et al. |
| 5,106,718 A | 4/1992 | Bartmann et al. |
| 5,126,231 A | 6/1992 | Levy |
| 5,137,780 A | 8/1992 | Nichols et al. |
| 5,169,494 A | 12/1992 | Hashimoto et al. |
| 5,198,153 A | 3/1993 | Angelopoulos et al. |
| 5,246,782 A | 9/1993 | Kennedy et al. |
| 5,302,548 A | 4/1994 | Watanabe et al. |
| 5,304,626 A | 4/1994 | Burgess et al. |
| 5,336,925 A | 8/1994 | Moss et al. |
| 5,340,684 A | 8/1994 | Hayase et al. |
| 5,370,969 A | 12/1994 | Vidusek |
| 5,397,684 A | 3/1995 | Hogan et al. |
| 5,403,438 A | 4/1995 | Motoyama |
| 5,443,941 A | 8/1995 | Bariya et al. |
| 5,542,971 A | 8/1996 | Auslander et al. |
| 5,545,588 A | 8/1996 | Yoo |
| 5,554,473 A | 9/1996 | Cais et al. |
| 5,607,824 A | 3/1997 | Fahey et al. |
| 5,632,910 A | 5/1997 | Nagayama et al. |
| 5,633,210 A | 5/1997 | Yang et al. |
| 5,667,940 A | 9/1997 | Hsue et al. |
| 5,688,987 A | 11/1997 | Meador et al. |
| 5,691,101 A | 11/1997 | Ushirogouchi et al. |
| 5,739,254 A | 4/1998 | Fuller et al. |
| 5,772,925 A | 6/1998 | Watanabe et al. |
| 5,807,790 A | 9/1998 | Gupta et al. |
| 5,892,096 A | 4/1999 | Meador et al. |
| 5,922,503 A | 7/1999 | Spak et al. |
| 5,925,578 A | 7/1999 | Bae |
| 5,939,235 A | 8/1999 | Kondo et al. |
| 5,952,448 A | 9/1999 | Lee et al. |
| 5,968,324 A | 10/1999 | Cheung et al. |
| 5,972,560 A | 10/1999 | Kaneko et al. |
| 5,998,569 A | 12/1999 | Hogan et al. |
| 6,015,650 A | 1/2000 | Bae |
| 6,020,269 A | 2/2000 | Wang et al. |
| 6,042,997 A | 3/2000 | Barclay et al. |
| 6,046,112 A | 4/2000 | Wang |
| 6,054,254 A | 4/2000 | Sato et al. |
| 6,063,547 A | 5/2000 | Ye et al. |
| 6,071,662 A | 6/2000 | Carmichael et al. |
| 6,103,456 A | 8/2000 | Tobben et al. |
| 6,110,653 A | 8/2000 | Holmes et al. |
| 6,121,098 A | 9/2000 | Strobl |
| 6,124,077 A | 9/2000 | Imai et al. |
| 6,127,070 A | 10/2000 | Yang et al. |
| 6,128,292 A | 10/2000 | Kim et al. |
| 6,136,511 A | 10/2000 | Reinberg et al. |
| 6,136,679 A | 10/2000 | Yu et al. |
| 6,156,658 A | 12/2000 | Wang et al. |
| 6,156,665 A | 12/2000 | Hamm et al. |
| 6,162,580 A | 12/2000 | Matsuoka et al. |
| 6,165,695 A | 12/2000 | Yang et al. |
| 6,171,763 B1 | 1/2001 | Wang et al. |
| 6,187,509 B1 | 2/2001 | Imai et al. |
| 6,200,907 B1 | 3/2001 | Wang et al. |
| 6,207,238 B1 | 3/2001 | Affinito |
| 6,232,386 B1 | 5/2001 | Vargo et al. |
| 6,251,562 B1 | 6/2001 | Breyta et al. |
| 6,268,108 B1 | 7/2001 | Iguchi et al. |
| 6,268,282 B1 | 7/2001 | Sandu et al. |
| 6,291,145 B1 | 9/2001 | Kokubo et al. |
| 6,306,560 B1 | 10/2001 | Wang et al. |
| 6,309,789 B1 | 10/2001 | Takano et al. |
| 6,309,926 B1 | 10/2001 | Bell et al. |
| 6,309,955 B1 | 10/2001 | Subramanian et al. |
| 6,316,165 B1 | 11/2001 | Pavelchek et al. |
| 6,319,649 B1 | 11/2001 | Kato et al. |
| 6,319,651 B1 | 11/2001 | Holmes et al. |
| 6,338,936 B1 | 1/2002 | Ichikawa et al. |
| 6,359,028 B1 | 3/2002 | Miya et al. |
| 6,361,833 B1 | 3/2002 | Nakada et al. |
| 6,380,611 B1 | 4/2002 | Yin et al. |
| 6,383,952 B1 | 5/2002 | Subramanian et al. |
| 6,391,472 B1 | 5/2002 | Lamb |
| 6,410,209 B1 | 6/2002 | Adams et al. |
| 6,426,125 B1 | 7/2002 | Yang et al. |
| 6,428,894 B1 | 8/2002 | Babich et al. |
| 6,440,640 B1 | 8/2002 | Yang et al. |
| 6,451,498 B1 | 9/2002 | Pirri et al. |
| 6,455,416 B1 | 9/2002 | Subramanian et al. |
| 6,458,509 B1 | 10/2002 | Haruta |
| 6,458,705 B1 | 10/2002 | Hung et al. |
| 6,487,879 B1 | 12/2002 | Blackwell et al. |
| 6,488,509 B1 | 12/2002 | Ho et al. |
| 6,509,137 B1 | 1/2003 | Wang et al. |
| 6,558,819 B1 | 5/2003 | Igarashi |
| 6,566,280 B1 | 5/2003 | Meagley et al. |
| 6,576,409 B2 | 6/2003 | Ichikawa et al. |
| 6,586,560 B1 | 7/2003 | Chen et al. |
| 6,602,652 B2 | 8/2003 | Adams et al. |
| 6,616,692 B1 | 9/2003 | Glick et al. |
| 6,638,853 B1 | 10/2003 | Sue et al. |
| 6,680,252 B2 | 1/2004 | Chen et al. |
| 6,709,979 B2 | 3/2004 | Komai et al. |
| 6,740,469 B2 | 5/2004 | Krishnamurthy et al. |
| 6,767,689 B2 | 7/2004 | Pavelchek et al. |
| 6,803,168 B1 | 10/2004 | Padmanaban et al. |
| 6,803,172 B2 | 10/2004 | Jung et al. |
| 6,838,223 B2 | 1/2005 | Yoon et al. |
| 6,844,131 B2 | 1/2005 | Oberlander et al. |
| 6,849,293 B2 | 2/2005 | Rawat |
| 6,852,473 B2 | 2/2005 | Roberts et al. |
| 6,852,474 B2 | 2/2005 | Sabnis |
| 6,872,506 B2 | 3/2005 | Neef et al. |
| 6,893,702 B2 | 5/2005 | Takahashi |
| 6,924,228 B2 | 8/2005 | Kim et al. |
| 6,976,904 B2 | 12/2005 | Li et al. |
| 7,074,527 B2 | 7/2006 | Lu et al. |
| 7,108,958 B2 | 9/2006 | Guerrero |
| 7,261,997 B2 | 8/2007 | Cox et al. |
| 7,265,431 B2 | 9/2007 | Sivakumar |
| 2002/0009599 A1 | 1/2002 | Welch et al. |
| 2002/0031729 A1 | 3/2002 | Trefonas, III et al. |
| 2002/0076642 A1 | 6/2002 | Zampini et al. |
| 2002/0106898 A1 | 8/2002 | Tsai |
| 2002/0110665 A1 | 8/2002 | Rutter, Jr. et al. |
| 2002/0120070 A1 | 8/2002 | Hong et al. |
| 2002/0120091 A1 | 8/2002 | Scott |
| 2002/0160211 A1 | 10/2002 | Kurita et al. |
| 2002/0182874 A1 | 12/2002 | Wang |
| 2002/0183426 A1 | 12/2002 | Lamb et al. |
| 2003/0017688 A1 | 1/2003 | Hsu et al. |
| 2003/0040179 A1 | 2/2003 | Thakar et al. |
| 2003/0049566 A1 | 3/2003 | Sabnis et al. |
| 2003/0064608 A1 | 4/2003 | Sabnis et al. |
| 2003/0122269 A1 | 7/2003 | Weber et al. |
| 2003/0129531 A1 | 7/2003 | Oberlander et al. |
| 2003/0129547 A1 | 7/2003 | Neisser et al. |
| 2003/0143404 A1 | 7/2003 | Welch et al. |
| 2003/0162120 A1 | 8/2003 | Yoon et al. |
| 2003/0194636 A1 | 10/2003 | Wanat et al. |
| 2003/0215736 A1 | 11/2003 | Oberlander et al. |
| 2004/0010062 A1 | 1/2004 | Ahn et al. |
| 2004/0018451 A1 | 1/2004 | Choi |

| | | | |
|---|---|---|---|
| 2004/0053141 | A1 | 3/2004 | Pierrat |
| 2004/0058275 | A1 | 3/2004 | Neef et al. |
| 2004/0077173 | A1 | 4/2004 | Sivakumar |
| 2004/0210034 | A1 | 10/2004 | Cox et al. |
| 2004/0220379 | A1 | 11/2004 | Park et al. |
| 2005/0074699 | A1 | 4/2005 | Sun et al. |
| 2005/0148170 | A1 | 7/2005 | Bhave et al. |
| 2005/0167394 | A1 | 8/2005 | liu et al. |
| 2005/0214674 | A1 | 9/2005 | Sui et al. |
| 2005/0255410 | A1 | 11/2005 | Guerrero et al. |
| 2006/0019455 | A1 | 1/2006 | Bu et al. |
| 2006/0063106 | A1 | 3/2006 | Cox et al. |
| 2006/0160028 | A1 | 7/2006 | Lee et al. |
| 2007/0018286 | A1 | 1/2007 | Chen |
| 2007/0082297 | A1* | 4/2007 | Choi et al. ............... 430/311 |
| 2007/0117049 | A1 | 5/2007 | Guerrero et al. |
| 2007/0196772 | A1 | 8/2007 | Jung |
| 2007/0207406 | A1 | 9/2007 | Guerrero et al. |
| 2007/0212649 | A1 | 9/2007 | Lalbahadoersing et al. |
| 2007/0212654 | A1 | 9/2007 | Larson et al. |
| 2007/0264830 | A1 | 11/2007 | Huang et al. |
| 2008/0044772 | A1 | 2/2008 | Guerrero et al. |
| 2009/0111281 | A1 | 4/2009 | Bencher et al. |

FOREIGN PATENT DOCUMENTS

| | | |
|---|---|---|
| EP | 1 061 560 | 12/2000 |
| EP | 1480081 | 11/2004 |
| EP | 1 772 776 | 4/2007 |
| EP | 1 845 416 | 10/2007 |
| GB | 2 288 184 | 11/1995 |
| JP | 48000891 | 1/1973 |
| JP | 06295064 | 10/1994 |
| JP | 07335884 | 12/1995 |
| JP | 08062401 A | 3/1996 |
| JP | 10149531 | 6/1998 |
| JP | 10307394 | 11/1998 |
| JP | 2003162065 | 6/2003 |
| JP | 2003183387 | 7/2003 |
| JP | 200570154 | 3/2005 |
| KR | 19970071126 | 11/1997 |
| KR | 1020010007323 | 1/2001 |
| WO | 2004/076465 | 9/2004 |
| WO | 2004113417 | 12/2004 |
| WO | 2005001901 | 1/2005 |
| WO | 2005093513 | 10/2005 |
| WO | 2005111719 | 11/2005 |
| WO | 2008/036496 | 3/2008 |
| WO | 2008/039705 | 4/2008 |

OTHER PUBLICATIONS

Office action dated Jul. 27, 2010 in related case U.S. Appl. No. 11/839,317, filed Aug. 15, 2007.
International Search Report and Written Opinion dated Jan. 9, 2008 in related case PCT/US2007/076078 filed on Aug. 16, 2007.
International Search Report on Patentability dated Dec. 3, 2008 in related case PCT/US2007/076078 filed on Aug. 16, 2007.
International Search Report and Written Opinion dated Aug. 20, 2009 in corresponding case PCT/US2009/032446 filed on Jan. 29, 2009.
International Preliminary Report on Patentability dated Aug. 12, 2010 in corresponding case PCT/US2009/032446 filed on Jan. 29, 2009.
Bencher, "SADP: The best option for <32nm NAND flash," Nanochip Technology Journal, vol. 5, No. 2, 2007, pp. 8-13.
Huang et al., "A new method to characterize conformality of BARC coatings," Proceedings of SPIE, vol. 5753, 2005, pp. 627-635.
Tseng et al., "A comprehensive comparison between double patterning and double patterning with spacer on sub-50nm product implementation," Proceedings of SPIE, vol. 6924, 2008, paper 69241Y.
International Search Report and Written Opinion dated Aug. 20, 2010 related case PCT/US2010/020199 filed on Jan. 6, 2010.
White et al, "Synthesis and Characterizations of Photodefinable Polycarbonates for Use as Sacrificial Materials in the Fabrication of Microfludic Devices," School of Chemical Engineering, Georgia Institute of Technology, Atlanta, GA 30332-0100, Advances in Resist Technology and Processing XIX, Theodore H. Fedynyshyn, Editor, Proceedings of SPIE, vol. 4690 (2002), pp. 242-253.
Sturtevant et al., "Removable Organic Antireflection Coating", Advances in Resist Technology and Processing XIII, Roderick R. Kunz, Chair/Editor, SPIE, vol. 2724, pp. 738-746 (Mar. 1996).
Yoshino et al., "Compatibility of Chemically Amplified Photoresists with Bottom Anti-Reflective Coatings," Advances in Resist Technology and Processing XV, Will Conley, Chair/Editor, SPIE, vol. 3333, pp. 655-661 (Feb. 1998).
Okoroanyanwu, "Limits of Ultrathin Resist Processes," Future Fab Intl., Sep. 2003, pp. 1-15, http://www.future-fab.com/login.asp?s_id=0&d_ID=1158&login=true&mode=print.
Translated Abstract of JP Pub No. JP 48000891, 1973, 1 page.
Translation of JP Pub No. JP 10307394, Nov. 11, 1998, 33 pages.
Translation of JP Pub No. JP 10149531, Jun. 2, 1998, 17 pages.
Translation of JP Pub No. JP 08062401A, Mar. 8, 1996, 7 pages.
Translated Abstract of JP No. 200570154, Mar. 17, 2005, 1 page.
Yamada et al., "Positive and Negative Tone Water Processable Photoresist: A Progress Report," SPIE vol. 3333, pp. 245-253 (1998).
Yamada et al., "The Design and Study of Aqueous-Processable Positive Tone Photoresists," SPIE vol. 3999. pp. 569-578 (2000).
Moon et al, "Three-Component Photopolymers Based on Thermal Cross-Linking and Acidolytic De-Cross-Linking of Vinyl Ether Groups. Effects of Binder Polymers on Photopolymer Characteristics," Chemistry of Materials, vol. 6, No. 10, Oct. 1994, pp. 1854-1860.
Translation of JP Pub No. JP 06295064, Oct. 21, 1994, 16 pages.
Lee et al., "Performance of Vinyl Ether Cross-Linkers on Resist for 193 nm Lithography," SPIE vol. 4690, pp. 541-548 (2002).
"Aqueous Processable Positive and Negative Tone Photoresists," Willson Research Group, University of Texas at Austin, Apr. 18, 2001, http://willson.cm.utexas.edu/Research/Sub_Files/Water_Soluble, 7 pages.
Guerrero et al., "Photochemical Studies on Bottom Anti-Reflective Coatings," Journal of Photopolymer Science and Technology, vol. 19, No. 3, 2006, pp. 343-347.
Mack, "Antireflective Coatings," Microlithography World, Summer 1997, pp. 29-30.
Rubin et al, "Ion Implantation in Silicon Technology," American Institute of Physics, Jun./Jul. 2003, pp. 12-15.
Case Technology Inc., Ion Implantation, www.casetechnology.com/links.html, pp. 1-24, 2006.
2.2.3 Implantation Dose, www.iue.tuwien.ac.at/phd/hoessinger/node23.html, 1 page.
2.2.2 Ion Beam Energy, www.iue.tuwien.ac.at/phd/hoessinger/node22.html, 5 pages.
2.2.4 Tilt and Twist Angle, www.iue.tuwien.ac.at/phd/hoessinger/node24.html, 2 pages.
2.2 Ion Implantation Process Parameters, www.iue.tuwien.ac.at/phd/hoessinger/node20.html, 1 page.
2.2.1 Dopant Species, www.iue.tuwien.ac.at/phd/hoessinger/node21.html, 2 pages.
Ion Implantation Process, p2library.nfesc.navy.mil/P2_Opportunity_Handbook/1_12.html, 6 pages, 2003.
Translation of JP Pub No. 2003162065; Jun. 6, 2003, 19 pages.
Okazaki et al., "Positive-Working Photosensitive Alakline-Developable Polyimide Precursor Based on Semi-Alicyclic Poly (amide acid), Vinyl Ether Crosslinker, and a Photoacid Generator," J. Photopolym Sci Technol, vol. 19, No. 2, p. 277-280, 2006.

* cited by examiner

ON-TRACK PROCESS FOR PATTERNING HARDMASK BY MULTIPLE DARK FIELD EXPOSURES

RELATED APPLICATIONS

This application claims the priority benefit of a provisional application entitled ON-TRACK PROCESS FOR PATTERNING HARDMASK BY MULTIPLE DARK FIELD EXPOSURES, Ser. No. 61/024,474, filed Jan. 29, 2008, incorporated by reference herein.

BACKGROUND OF THE INVENTION

1. Field of the Invention

The present invention relates in general to the process of fabricating semiconductor structures by microphotolithography and, more particularly, by multiple exposures for pitch multiplication.

2. Description of the Prior Art

The advances of microelectronic manufacture are reflected by the density and dimensions of semiconductor structures created by the microphotolithographic process. The demand for high density and small critical dimension (CD) has been constantly pushing photolithography technology to its limits. At the limits of a photolithographic process, features with relaxed pitch can be created with a smaller CD than that with high pitches, e.g., 1:1 line/space. The trade-off of such processes for smaller CDs is the reduction of feature density. By principle, the loss of density can be compensated for by repeating the exposure process.

The potential for smaller CDs had not been seriously investigated until recently, primarily for two reasons: (1) the high cost and high complexity of the multiple exposure process, and (2) the availability of other options for CD reduction. In the last 10 years, the microelectronics industry primarily relied on shorter radiation wavelengths of exposure tools for smaller CDs. The photolithography technology has successfully evolved from i-line (365 nm) to KrF (248 nm) and ArF (193 nm).

Patterns of 45-nm line/space with 1:1 pitch can be printed reliably with 193-nm immersion photolithography. However, as immersion photolithography quickly reaches its resolution limit, trends toward improving the photolithography process have included the use of high numerical aperture (NA) tools and/or immersion fluids. Using imaging tools with high NA capabilities (>1.0) by themselves or in combination with immersion provides a method to achieve higher resolution of patterns with smaller critical dimension and higher density. These advances are possible because of the larger amount of light that can be transferred to the imaging layer. However, these options are quite costly and require new tool sets.

More recently, multiple exposure technology for the next printing node has become the only viable option until exposure wavelengths shorter than 193 nm, such as 13.5 nm, are available. Many process schemes for multiple exposure technology have been investigated and reported. Most of these schemes utilize a bright field mask. In another words, only small portions of the photoresist, such as lines, are protected from the exposure, while the remaining portion of the resist is exposed. The photoresist is then contacted with developer to remove the exposed portions of the resist, thereby leaving only the unexposed portion of the photoresist (i.e., the lines) remaining above the hardmask layer. The pattern is transferred to the hardmask by etching away the hardmask layer except for those areas underneath the unexposed portions of the photoresist. The process is repeated until the desired pattern is achieved. One drawback to the traditional bright field process is that a hardmask must be reapplied to the substrate before the second exposure-development-etching process. This additional step increases processing time as well as overall cost. Little attention has been paid to processes utilizing a dark field mask to form features such as vias or trenches. In a dark field exposure process, a large portion of the photoresist is protected from exposure, while only the small portions of the photoresist are exposed and removed after development. As with bright field, the pattern must then be transferred to the hardmask using an etching process.

Thus, existing double exposure processes require a dry-etch step between the two exposures. In other words, the patterns achieved from the first exposure must be transferred to the underlying layer by reactive ion etching (RIE) before the second exposure can be processed. The dry-etch step greatly complicates the double exposure technology. Accordingly, there is a need in the art for multiple patterning techniques that do not require the application of a second hardmask layer, and also eliminate the dry-etch step.

SUMMARY OF THE INVENTION

The present invention overcomes these problems by broadly providing methods of forming microelectronic structures, particularly for multiple-exposure processes, compositions for forming such structures, and the structures thereof.

In more detail, the method comprises applying a hardmask composition to the surface of a substrate. The hardmask composition comprises a polymer dispersed or dissolved in a solvent system. The composition is baked to yield a hardmask layer on the substrate. A photosensitive composition is applied on the hardmask layer to form a first imaging layer on top of the hardmask layer, and the first imaging layer is exposed to activating radiation to yield exposed portions in the first imaging layer. The first imaging layer is contacted with a developer, so as to remove the exposed portions of the imaging layer. Advantageously, this also results in the removal of portions of the hardmask layer beneath the exposed portions in the first imaging layer, yielding a patterned hardmask layer. The first imaging layer is then contacted with an organic solvent to remove the first imaging layer from the hardmask layer. A second photosensitive composition is applied to the hardmask layer to form a second imaging layer on top of the patterned hardmask layer. This is accomplished without adding additional hardmask composition to the substrate.

The present invention also provides an inventive hardmask composition comprising a polymer dispersed or dissolved in a solvent system. The polymer comprises recurring monomers of

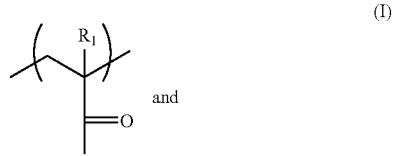

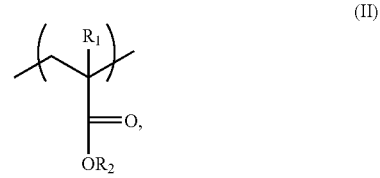

where each $R_1$ is individually selected from the group consisting of —H, and alkyl groups, and each $R_2$ is individually selected from the group consisting of —H, and silicon-containing moieties. The silicon-containing moieties are selected from the group consisting of

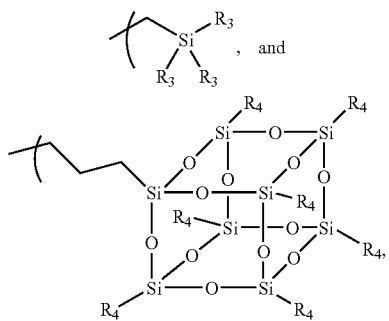

where each $R_3$ is selected from the group consisting of alkyl groups, and each $R_4$ is selected from the group consisting of n-butyl, t-butyl, and alkyl groups, and wherein at least one of said $R_2$ is a silicon-containing moiety.

In another embodiment, there is provided a microelectronic structure comprising a substrate having a surface and a hardmask layer adjacent the substrate surface. The hardmask layer is formed from a hardmask composition comprising a polymer dispersed or dissolved in a solvent system, where the polymer comprises recurring monomers of

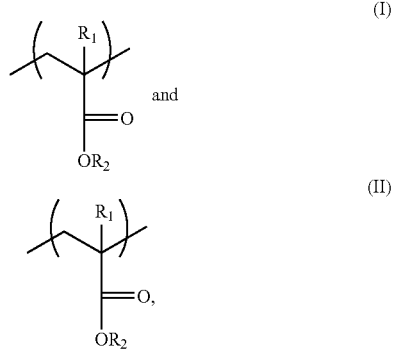

where each $R_1$ is individually selected from the group consisting of —H, and alkyl groups, and each $R_2$ is individually selected from the group consisting of —H, and silicon-containing moieties. The silicon-containing moieties are selected from the group consisting of

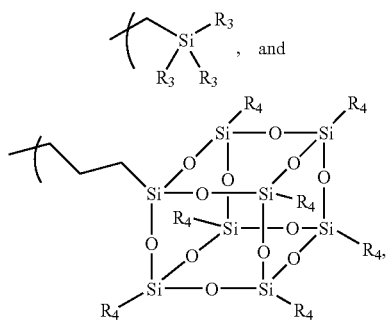

where each $R_3$ is selected from the group consisting of alkyl groups, and each $R_4$ is selected from the group consisting of n-butyl, t-butyl, and alkyl groups, and wherein at least one of said $R_2$ is a silicon-containing moiety.

The present invention also provides another inventive method of forming a microelectronic structure by applying a hardmask composition to the surface of a substrate. The hardmask composition comprises a polymer dispersed or dissolved in a solvent system. The composition is baked to form a hardmask layer on the substrate. A photosensitive composition is applied on the hardmask to form a first imaging layer on top of the hardmask layer, and the first imaging layer is exposed to activating radiation to yield exposed portions in the first imaging layer. The first imaging layer is contacted with a developer, so as to remove the exposed portions of the imaging layer. Advantageously, this also results in the removal of portions of the hardmask layer beneath the exposed portions in the first imaging layer, yielding a patterned hardmask layer. The first imaging layer is then contacted with an organic solvent to remove the first imaging layer from the patterned hardmask layer. A second photosensitive composition is applied to the patterned hardmask layer to form a second imaging layer on top of the patterned hardmask layer. This is accomplished without any dry etching occurring during the foregoing process.

DETAILED DESCRIPTION OF THE PREFERRED EMBODIMENTS

The Inventive Method

The present invention provides methods to create via or trench structures on a semiconductor substrate through a multiple exposure process. FIG. 1 illustrates one embodiment of the invention. A substrate 10 having an upper surface 10a and a backside 10b is provided. An etch stop layer 12 can be applied to the backside 10b of the substrate 10. Any conventional microelectronic substrate can be utilized. Preferred substrates include those selected from the group consisting of silicon, SiGe, $SiO_2$, $Si_3N_4$, aluminum, tungsten, tungsten silicide, gallium arsenide, germanium, tantalum, tantalum nitride, coral, black diamond, phosphorous or boron doped glass, and mixtures of the foregoing. The substrate 10 can have a planar surface, or it can include topography (via holes, trenches, contact holes, raised features, lines, etc.).

Figure 1A:
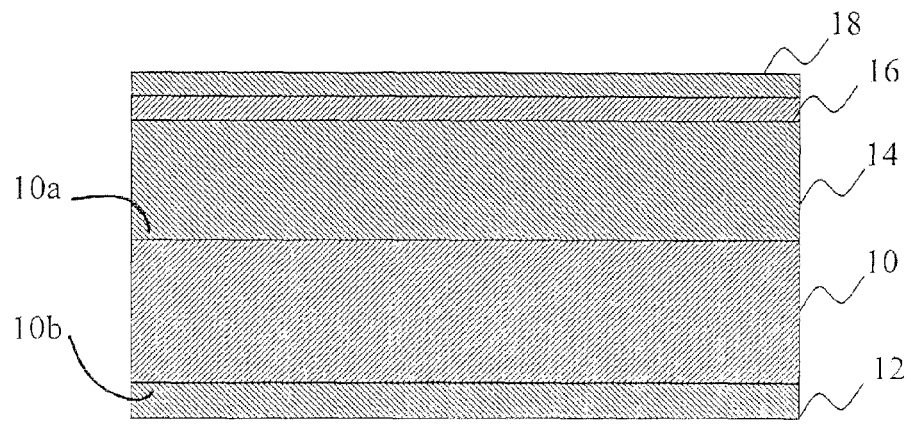
FIGS. 1(a)-1(i) illustrate one embodiment of the inventive multiple exposure process.
Figure 1B:
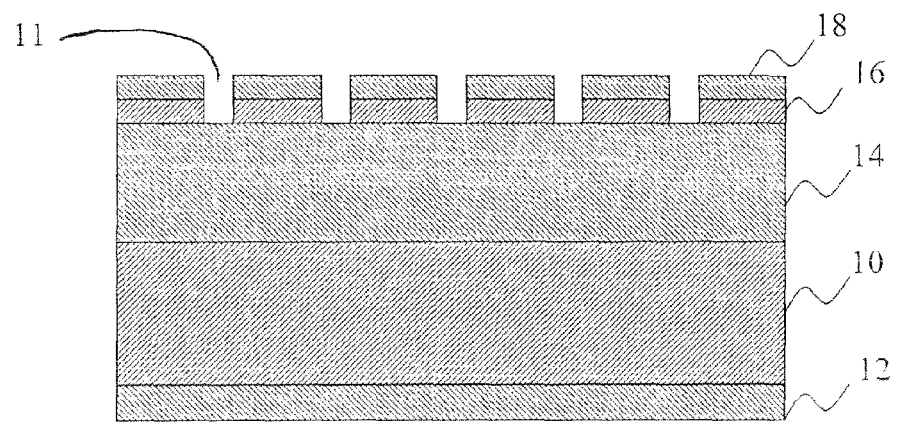

As shown in FIG. 1(a), an optional intermediate layer 14 is applied to the upper surface 10a of substrate 10. The intermediate layer 14 can be applied by any known application method, such as by spin-coating or vapor deposition. The intermediate layer is then baked. Preferred baking conditions involve temperatures of at least about 100° C., preferably from about 120° C. to about 250° C., and more preferably from about 180° C. to about 220° C., and for a time period of from about 20 seconds to about 60 seconds. Suitable intermediate layers 14 include those selected from the group consisting of spin-on carbon layers (SOC), amorphous carbon layers, bottom anti-reflective coatings, planarization layers, and combinations of the foregoing. Preferably, the intermediate layer 14 has a refractive index (n-value) of from about 1.4 to about 2, and more preferably from about 1.6 to about 2, and an extinction coefficient (k-value) from about 0.1 to about 0.8, and more preferably from about 0.4 to about 0.6 at the wavelength of use (e.g., 365 nm, 248 nm, 193 nm, 157 nm, or 13.5 nm).

A layer of a hardmask composition is then applied to the intermediate layer 14, or to the substrate surface 10$a$, if no intermediate layer 14 is present. The composition can be applied by any known application method, with one preferred method being spin-coating the composition at speeds of from about 1,000 rpm to about 4,000 rpm (preferably from about 1,500 rpm to about 2,500 rpm) for a time period of from about 10 seconds to about 60 seconds (preferably from about 20 seconds to about 60 seconds). The hardmask composition is then baked so as to induce thermal crosslinking to form a hardmask layer 16. Preferred baking conditions involve temperatures of at least about 10° C., preferably from about 120° C. to about 250° C., and more preferably from about 160° C. to about 200° C., and for a time period of from about 20 seconds to about 60 seconds. A two-step thermal curing process can also be used wherein the hardmask ask layer 16 is baked at a temperature of from about 80° C. to about 120° C., for a time period of from about 10 seconds to about 60 seconds, followed by baking at a temperature of from about 160° C. to about 200° C., for a time period of from about 20 seconds to about 60 seconds. The thickness of the crosslinked hardmask layer 16 will typically be from about 20 nm to about 150 nm, and preferably from about 30 nm to about 100 nm.

Preferably, the cured hardmask layer 16 has n- and k-values that are compatible with the optical indices of the intermediate layer 14, if present. More preferably, the hardmask layer 16 has an n-value of from about 1.4 to about 2, and more preferably from about 1.6 to about 2, and a k-value of from about 0 to about 0.6 at the wavelength of use (e.g., 365 nm, 248 nm, 193 nm, 157 nm, or 13.5 nm).

Advantageously, the cured hardmask layer 16 will be sufficiently crosslinked that it will be substantially insoluble in typical organic solvents such as ethyl lactate, propylene glycol methyl ether acetate (PGMEA), propylene glycol methyl ether (PGME), propylene glycol n-propyl ether (PnP), cyclohexanone, acetone, Gamma butyrolactone (GBL), and mixtures thereof. Thus, when subjected to a stripping test, the cured hardmask layer 16 will have a percent stripping of less than about 5%, preferably less than about 1%, and even more preferably about 0%. The stripping test involves first determining the thickness by taking the average of measurements at five different locations of the cured layer. This is the initial average film thickness. Next, a solvent (e.g., ethyl lactate) is puddled onto the cured film for about 20 seconds, followed by spin drying at about 2,000-3,500 rpm for about 20-30 seconds to remove the solvent. The thickness is measured again at five different points on the wafer using ellipsometry, and the average of these measurements is determined. This is the average final film thickness.

The amount of stripping is the difference between the initial and final average film thicknesses. The percent stripping is:

$$\% \text{ stripping} = \left(\frac{\text{amount of stripping}}{\text{initial average film thickness}}\right) \times 100.$$

A photosensitive composition can then be applied to the cured hardmask layer 16 to form an imaging layer 18. The imaging layer 18 is then post-application baked ("PAB") at a temperature of at least about 80° C., preferably from about 80° C. to about 130° C., and more preferably from about 100° C. to about 120° C., and for time periods of from about 60 seconds to about 120 seconds. Suitable imaging compositions include commercially-available photoresists, or any other photosensitive compositions. Preferably, the imaging composition has a low solids content and can be applied as a very thin layer. Since dry-etching is not required to transfer the pattern from the imaging layer 18 to subsequent layers in this inventive process, the imaging layer 18 does not serve as a masking layer for pattern transfer etching. This provides a number of benefits to the patterning process. For example, unlike conventional techniques, the minimum thickness of the imaging layer 18 in the inventive process is no longer limited by etch selectivity and etch depth. As a result, an imaging composition having a solids content (prior to baking) of less than about 20% by weight, and more preferably from about 3% to about 10% by weight, can be used. The thickness of the imaging layer 18 after baking will typically be from about 20 nm to about 200 nm, and more preferably from about 40 nm to about 100 nm. Conventional photoresists generally cannot form such thin layers. Thus, an imaging composition can be specifically prepared for this purpose, or a commercially-available photoresist can be diluted until the desired solids content is achieved. Thinning of the photoresist is preferably accomplished by diluting with organic solvents selected from the group consisting of ethyl lactate, PGMEA, PGME, PnP, 2-heptanone, and mixtures thereof, in sufficient amounts to decrease the solids content of the photoresist as described herein. The resulting stack of films is shown in FIG. 1($a$).

The imaging layer 18 then exposed to radiation with a photomask (not shown) positioned above the surface of the imaging layer 18. The mask has open areas designed to permit radiation to pass through the mask and contact surface of imaging layer 18. The remaining solid portions of the mask are designed to prevent radiation from contacting the surface of imaging layer 18 in certain areas. Those skilled in the art will readily understand that the arrangement of open areas and solid portions is designed based upon the desired pattern to be formed in the imaging layer 18 and ultimately in the substrate 10. However, the present invention is particularly suitable for dark field processes to form small features such as vias or trenches. Thus, the photomask is preferably a dark field mask and is used to protect a large portion of the imaging layer 18 from exposure, while only a small portion of the imaging layer 18 is exposed at a time. It is particularly preferred that at least about 50% of the imaging layer 18 surface is protected from radiation during exposure, even more preferably from about 50% to about 90% of the imaging layer 18 is protected, and most preferably from about 60% to about 80% of the imaging layer 18 is protected from radiation during each exposure. The present inventive process can be used with radiation of most wavelengths under 500 mm, but preferred wavelengths are selected from the group consisting of 365 nm, 248 nm, 193 nm, 157 nm, and 13.5 nm.

Upon exposure, the portions of the imaging layer 18 that are exposed to radiation are rendered soluble in photoresist developer forming the vias and trenches 11. After exposure, the imaging layer 18 and hardmask layer 16 are preferably subjected to a post-exposure bake (PEB) at a temperature of from about 80° C. to about 180° C., more preferably from about 100° C. to about 180° C., for a time period of from about 60 seconds to about 120 seconds. The exposed portions of the imaging layer 18, which were made soluble by the above process, are then contacted with a photoresist developer to remove the exposed portions. Importantly, as the exposed via or trench areas 11 on the imaging layer 18 are dissolved, the portions of the hardmask layer 16 under the via or trench areas 11 are removed as well (see FIG. 1(b)). This eliminates the dry etch step required by prior art processes to transfer the pattern from the imaging layer 18 to underlying layers. In one aspect of the invention, the hardmask layer 16 is photosensitive (i.e., undergoes a reaction when exposed to activating radiation) and is decrosslinked by the exposure process thereby rendering it developer-soluble along with the imaging layer 18. In another aspect of the invention, the solubility of the hardmask layer 16 is unaffected by the exposure process, meaning that it will develop at the same rate for the exposed and unexposed areas. However, in the present method, the unexposed areas of hardmask layer 16 are protected from developer removal by the unexposed portions of the imaging layer 18, resulting in only the exposed portions of the hardmask layer 16 being removed.

Either way, the hardmask layer 16 is simultaneously developed with the imaging layer 18. Thus, the portions of the hardmask layer 16 underneath the exposed portions of the imaging layer 18 are removed by the developer as the imaging layer 18 is removed to form the vias and trenches 11 in both the imaging layer 18 and hardmask layer 16, yielding a patterned imaging layer 18 and a patterned hardmask layer 16 (FIG. 1(b)). Preferably, at least about 95% of the exposed portions of the imaging layer 18 and hardmask layer 16 will be removed by the developer, more preferably at least about 99%, and even more preferably about 100% will be removed. Suitable developers are organic or inorganic alkaline solutions such as tetramethylammonium hydroxide (TMAH) or KOH, and preferably comprise an aqueous solution of TMAH at a concentration of 0.26N or lower. Preferably, the dissolution rate of the hardmask layer 16 in 0.26N TMAH developer will be from about 0.5 nm/second to about 5 nm/second, and even more preferably from 0.5 nm/second to about 3 nm/second.

Figure 1C:
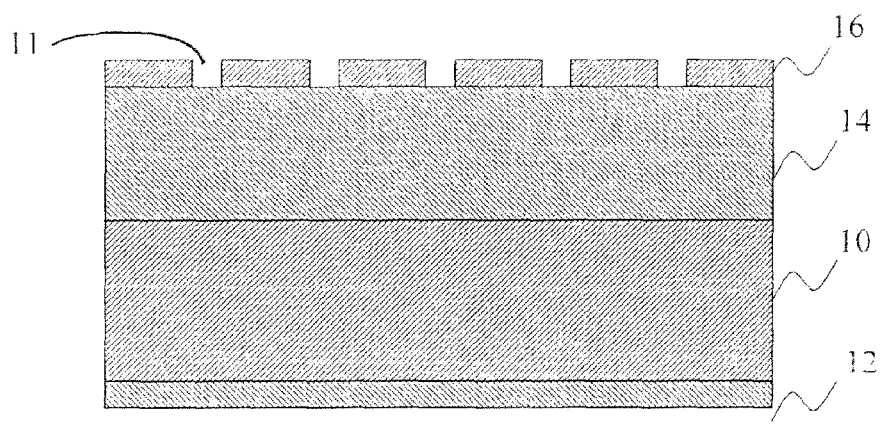

As shown in FIG. 1(c), the patterned imaging layer 18 is subsequently removed with organic solvents. A preferred process comprises puddling organic solvents on the imaging layer 18 for about 5 seconds to about 60 seconds and, more preferably, from about 5 seconds to about 20 seconds, followed by rinsing with additional solvent and spinning dry. Suitable organic solvents include those selected from the group consisting of PGME, PGMEA, ethyl lactate, commercial edge bead removers, and pre-wet solvents. Advantageously, the imaging layer 18 is removed, while the via and/or trench patterns 11 on the patterned hardmask layer 16 are preserved and remain intact due to the hardmask layer's 16 resistance to organic solvents, as explained above. More preferably, the imaging layer 18 is at least about 95% removed by the organic solvents, more preferably at least about 99%, and even more preferably 100% removed.

Figure 1D:
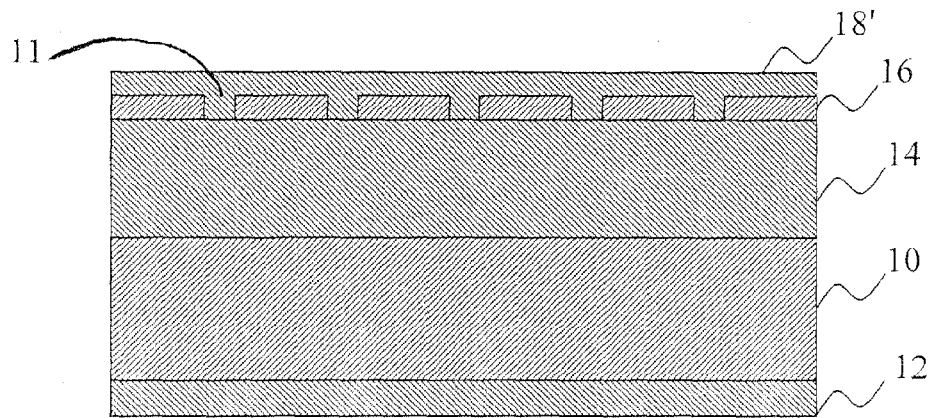
Figure 1E:
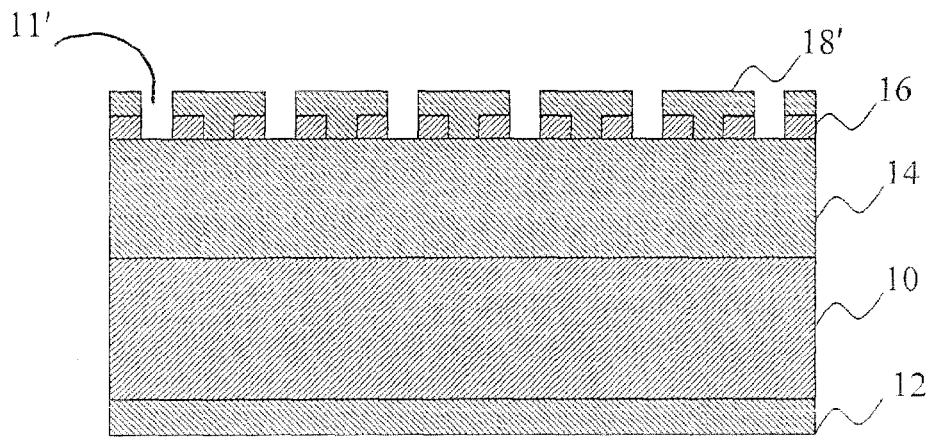

The exposure-development process is then repeated. As shown in FIG. 1(d), a second imaging layer 18' is applied to the patterned hardmask layer 16, filling the vias and trenches 11 formed during the first exposure-development process. The second imaging layer 18' is preferably applied in a thin layer, followed by a PAB, as described above. A photomask (not shown) is then positioned above the surface of the imaging layer 18' in a slightly different alignment than the existing patterned vias and trenches 11. Again, a dark field mask is preferably used, so that at least about 50% of the imaging layer 18' surface is protected from radiation during exposure, even more preferably from about 50% to about 90% of the imaging layer 18' is protected, and most preferably from about 60% to about 80% of the imaging layer 18' is protected from radiation during each exposure. The stack is then exposed to radiation at the selected wavelength to pattern the second imaging layer 18'. After exposure, the second imaging layer 18' and hardmask layer 16 are preferably subjected to a PEB, as described above. The exposed portions of the imaging layer 18' and hardmask layer 16 are then removed using a photoresist developer such as an aqueous solution of TMAH to form vias and trenches 1' in the imaging layer 18' and hardmask layer 16, yielding a patterned imaging layer 18' and a further patterned hardmask layer 16 (see FIG. 1 (e)).

Figure 1F:
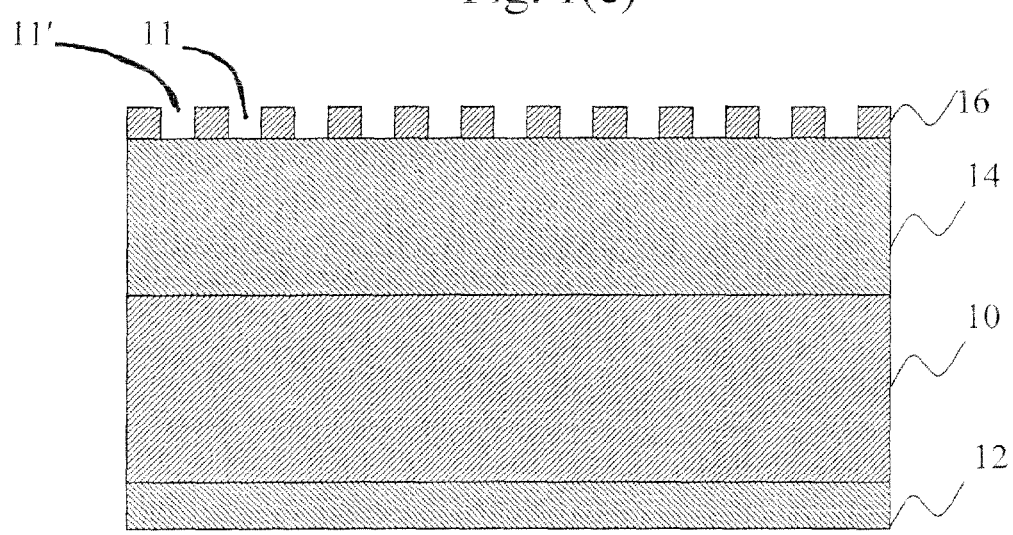

As shown in FIG. 1(f), the patterned imaging layer 18' is subsequently removed with organic solvents. Both sets of via or trench patterns 11, 11' on the patterned hardmask layer 16 from the dual exposure-development processes are preserved due to the hardmask layer's 16 resistance to organic solvents. It will be appreciated that additional imaging layers could again be applied to the same hardmask layer 16, and the exposure-development process repeated as many times as necessary (e.g., from 2-4 times, even more preferably from 2-3 times) to form the desired pattern in the hardmask. Unlike conventional bright field exposure processes, it is not necessary to reapply the hardmask layer between exposure-development processes. That is, the same hardmask layer 16 is used throughout the multiple exposure-development process. Advantageously, it is also not necessary for any dry etching to occur during the foregoing process.

Figure 1G:
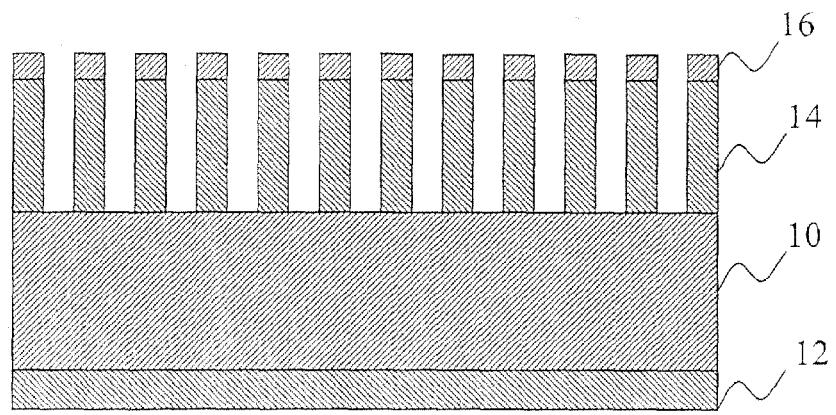
Figure 1H:
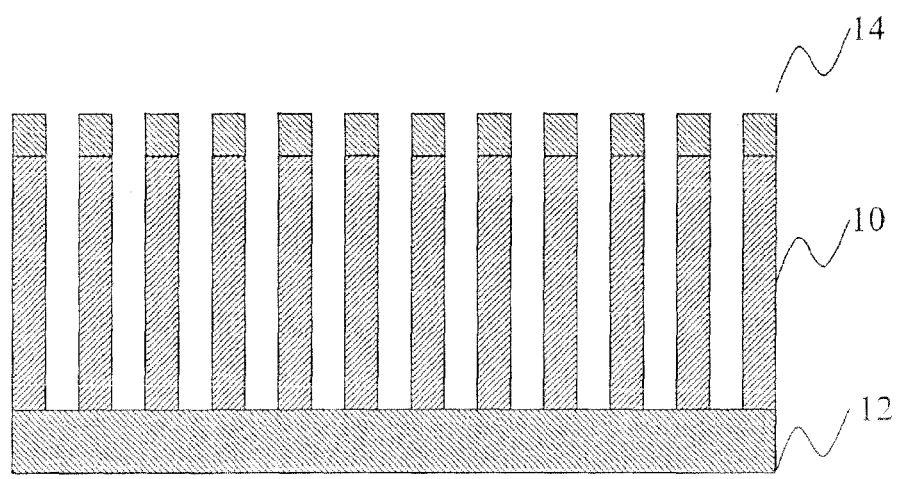
Figure 1I:
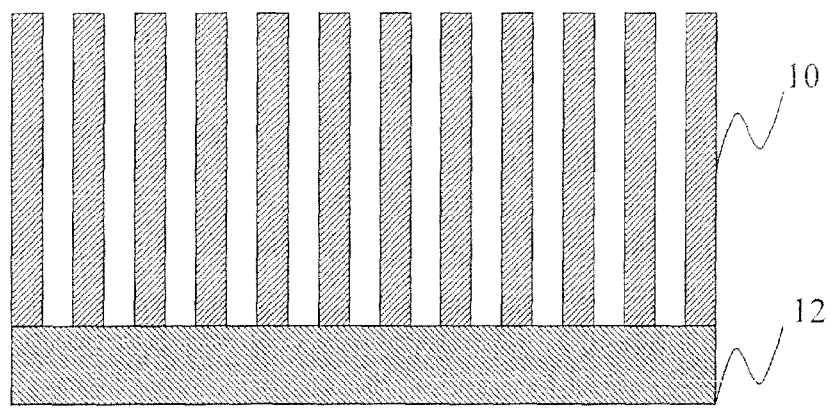
Figure 2A:
FIGS. 2(a)-2(h) illustrate an alternative embodiment of the inventive multiple exposure process.
Figure 2B:
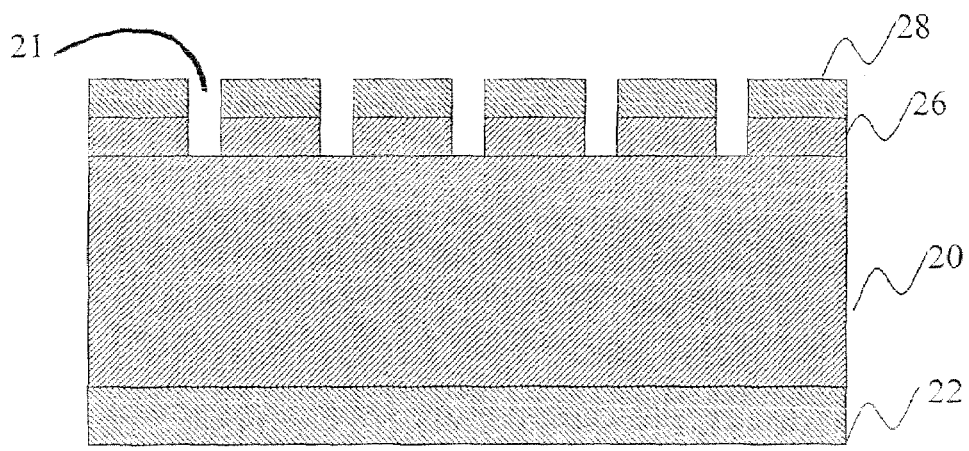
Figure 2C:
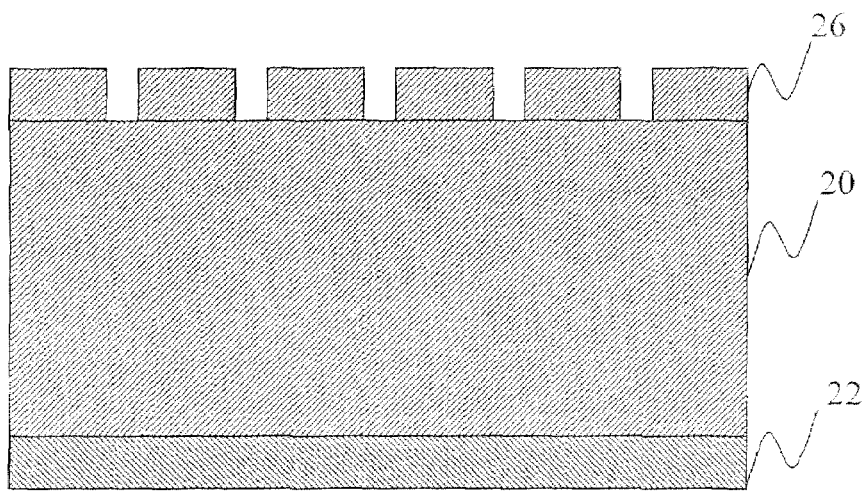
Figure 2D:
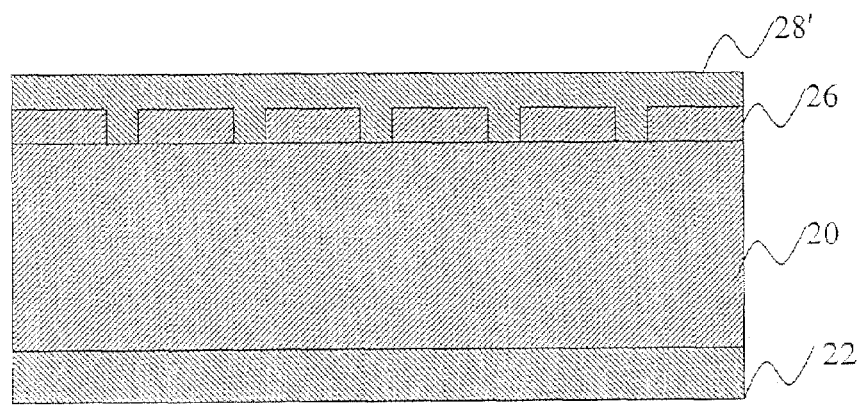
Figure 2E:
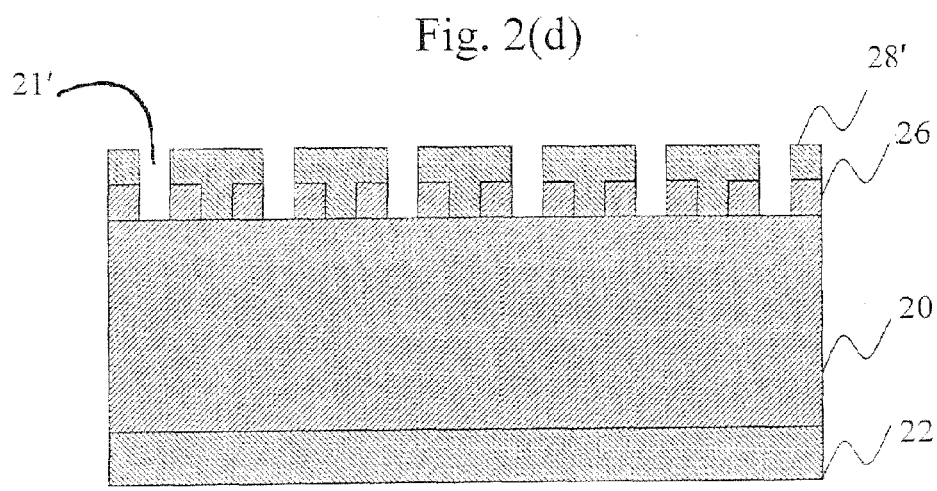
Figure 2F:
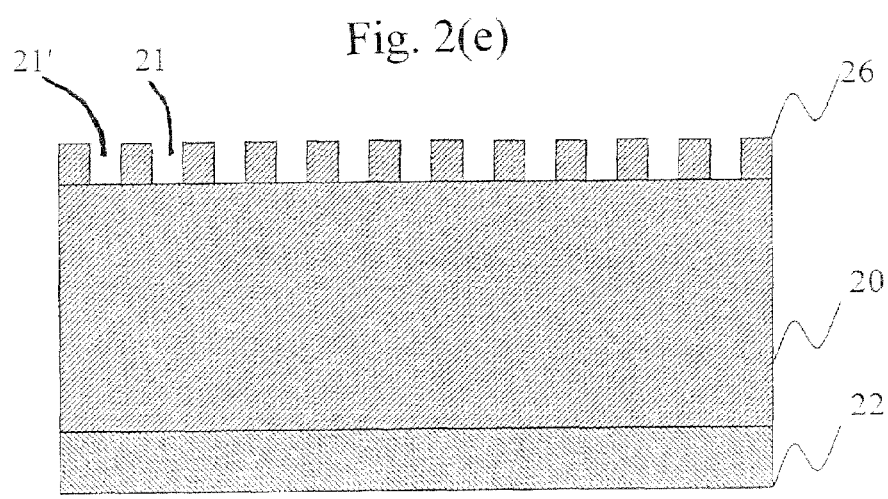
Figure 2G:
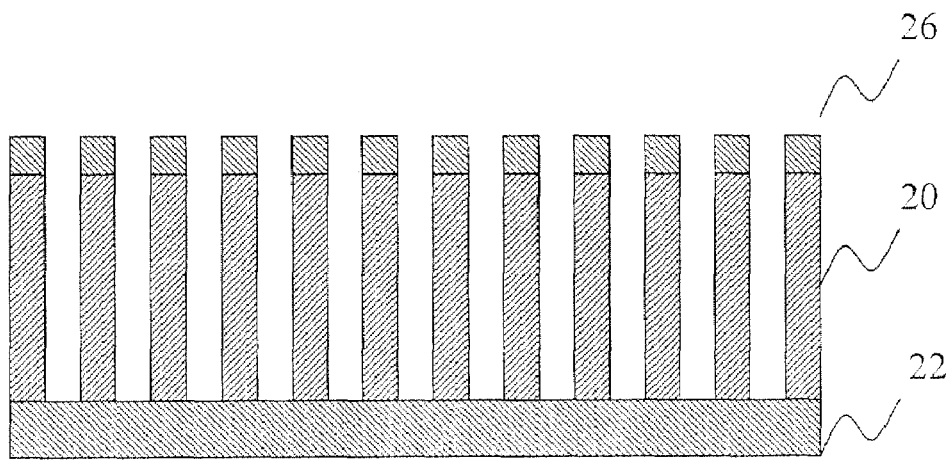
Figure 2H:
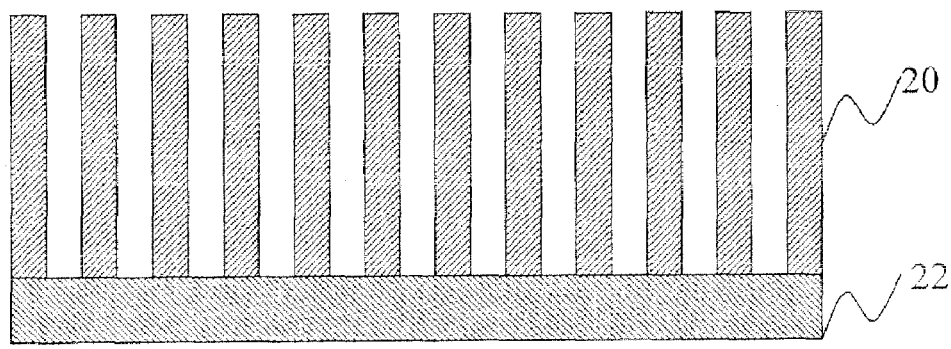

Ultimately, the patterns 11, 11' on the hardmask layer 16 are transferred to the intermediate layer 14, if present, (FIG. 1(g)) and then to the substrate 10 (FIG. 1(h)), using any conventional etching process, such as reactive ion etching (RIE). The hardmask layer 16 preferably has a high etch selectivity over the intermediate layer 14 or substrate 10 when using an etchant such as oxygen, chlorine, HBr, etc., or any combinations of those gases and/or other gases. Thus, the etch selectivity of the hardmask layer 16 over the intermediate layer 14 or substrate 10 will be at least about 1, preferably at least about 2, and more preferably from about 2 to about 50, when using an etchant selected from the group consisting of $O_2$, $CO_2$, $N_2$, Ar, Cl, HBr, He, and mixtures thereof. Once the hardmask layer 16 is removed (FIG. 1(h)), the remaining intermediate layer 14 is stripped using organic solvents. The resulting patterned substrate is depicted in FIG. 1(i).

As mentioned above, the intermediate layer 14 is optional. Thus, in an alternate embodiment, the intermediate layer 14 may be omitted if the hardmask layer 16 has adequate etch selectivity over the substrate 10 for pattern transfer using an etching process such as RIE. This embodiment is depicted in FIG. 2. In particular, a substrate 20 having an upper surface 20a and a backside 20b is provided. An etch stop layer 22 can be applied to the backside 20b of the substrate 20. A layer of a hardmask composition is then applied to substrate surface 20a by any conventional method, such as by spin coating. The hardmask composition is then baked so as to induce thermal crosslinking and form a hardmask layer 26, as discussed above. An imaging layer 28 can then be applied to the cured hardmask layer 26. Vias and trenches 21, 21' are then formed using the same processes of exposure, development (FIG. 2(b)), imaging layer stripping (FIG. 2(c)), and pattern transfer as described above, with a second imaging layer 28' being used for the second exposure-development process (FIGS. 2(d)-(h)).

The inventive multiple-exposure methods are useful for creating dense regions of vias and trenches while eliminating the hardmask reapplication step used in a traditional bright field process, as well as the dry-etch step used in conventional double-exposure methods.

Compositions for Use in the Inventive Method

Suitable hardmask compositions for use in the multiple exposure-development method are preferably thermally curable (i.e., crosslinkable). The preferred compositions will comprise a polymer and a crosslinking agent dissolved or dispersed in a solvent system. Preferably the polymer is a silicon- or titanium-containing polymer. The polymers preferably have a weight average molecular weight ($M_w$) of from about 800 Daltons to about 50,000 Daltons, and more preferably from about 5,000 Daltons to about 15,000 Daltons.

The inventive composition should also be wet-developable (i.e., developer soluble), or capable of being rendered developer soluble upon exposure to radiation of a selected wavelength. Thus, in one aspect, the cured layer is insoluble in both organic solvents and photoresist developers, but can be decrosslinked and rendered wet-developable upon exposure to radiation (i.e., the hardmask composition is photosensitive). This results in exposed and unexposed portions of the hardmask layer having different dissolution rates, allowing the exposed portions to be removed without removing the unexposed portions. Particularly preferred photosensitive hardmask compositions comprise a polymer dispersed or dissolved in a solvent system, where the polymer comprises recurring monomers of

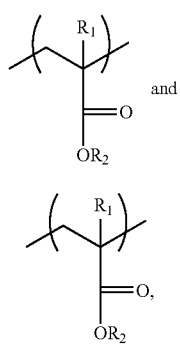

where each $R_1$ is individually selected from the group consisting of —H, and alkyl groups (preferably $C_1$-$C_4$ alkyls, and more preferably $C_1$-$C_3$ alkyls), and each $R_2$ is individually selected from the group consisting of —H, and silicon-containing moieties, wherein at least one of said $R_2$ is a silicon-containing moiety. Preferred silicon-containing moieties are selected from the group consisting of

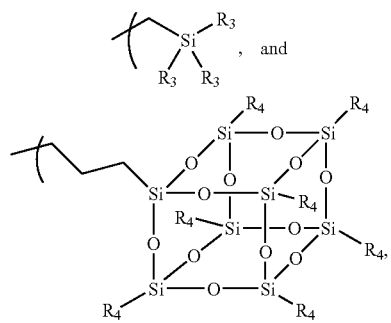

where each $R_3$ is selected from the group consisting of alkyl groups (preferably $C_1$-$C_4$ alkyls, and more preferably $C_1$-$C_3$ alkyls), and each $R_4$ is selected from the group consisting of n-butyl, t-butyl, and alkyl groups (preferably $C_2$-$C_3$ alkyls). The most preferred $R_3$ groups are selected from the group consisting of —CH$_3$ and —CH$_2$—CH$_3$. Preferably the ratio of monomer (I) to monomer (II) in the polymer is from about 0.2:0.8 to about 0.8:0.2, and more preferably from about 0.5:0.5 to about 0.8:0.2, where $R_2$ of monomer (I) is a silicon-containing moiety. In some embodiments, the polymer can further comprise recurring styrene monomers.

In another aspect, the cured hardmask layer is simultaneously insoluble in organic solvents, while remaining soluble in photoresist developers. Examples of such compositions comprise a polymeric metal alkoxide dispersed or dissolved in a solvent system. Preferred polymers comprise recurring units having the formula

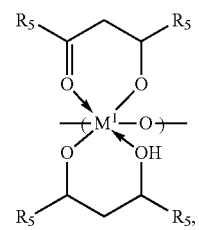

where each $R_5$ is individually selected from the group consisting of hydrogen, and alkyl groups (preferably $C_1$-$C_8$ alkyls), and $M^1$ is a metal. The most preferred $R_5$ groups are selected from the group consisting of —CH$_3$ and —CH$_2$—CH$_3$. The most preferred metals are selected from the group consisting of Ti, Zr, Si, and/or Al. Other suitable compositions are also described in U.S. Pat. No. 6,740,469, incorporated by reference herein.

The composition is formed by simply dispersing or dissolving the polymer in a suitable solvent system, preferably at ambient conditions and for a sufficient amount of time to form a substantially homogeneous solution. The polymer should be present in the composition at a level of from about 1% to about 20% by weight, preferably from about 2% to about 15% by weight, and even more preferably from about 3% to about 10% by weight, based upon the total weight of the composition taken as 100% by weight.

The compositions will also preferably include a crosslinker (used interchangeably herein with the term "crosslinking agent") dissolved or dispersed in the solvent system with the polymer. Preferred crosslinkers are selected from the group consisting of vinyl ether crosslinkers, and aminoplast crosslinking agents (e.g., Cymel® products available from Cytec Industries). It is particularly preferred that the crosslinkers be multi-functional (di-, tri-, and tetra-functional). The crosslinker is preferably present in the composition at a level of from about 0.2% to about 10% by weight, preferably from about 0.5% to about 5% by weight, and even more preferably from about 0.5% to about 2% by weight, based upon the total weight of the composition taken as 100% by weight.

More preferably, the vinyl ether crosslinkers, when present, have the formula $$R'—(X—O—CH=CH_2)_n,$$

where R' is selected from the group consisting of aryls (preferably $C_6$-$C_{14}$) and alkyls (preferably $C_1$-$C_{18}$, and more preferably $C_1$-$C_{10}$), each X is individually selected from the group consisting of alkyls (preferably $C_1$-$C_{18}$, and more preferably $C_1$-$C_{10}$), alkoxys (preferably $C_1$-$C_{18}$, and more preferably $C_1$-$C_{10}$), carbonyls, and combinations of two or more of the foregoing, and n is at least 2, and preferably from 2-6. The most preferred vinyl ethers include those selected from the group consisting of ethylene glycol vinyl ether, trimethylolpropane trivinyl ether, 1,4-cyclohexane dimethanol divinyl ether, and mixtures thereof. Another preferred vinyl ether has a formula selected from the group consisting of

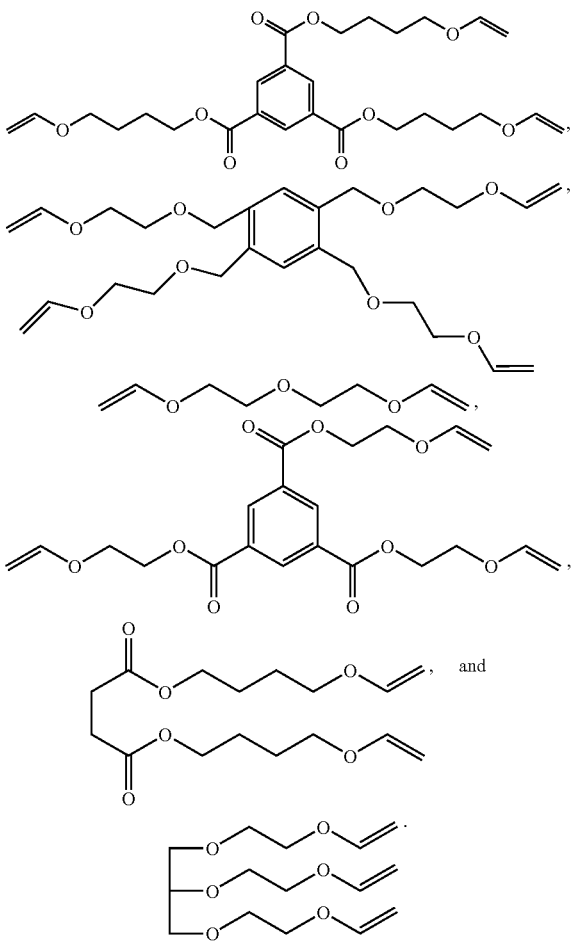

Preferred solvent systems include a solvent selected from the group consisting of PGMEA, PGME, PnP, ethyl lactate, and mixtures thereof. Preferably, the solvent system has a boiling point of from about 50-250° C., and more preferably from about 100-175° C. The solvent system should be utilized at a level of from about 80% to about 99.5% by weight, preferably from about 90% to about 99.5% by weight, and even more preferably from about 90% to about 99% by weight, based upon the total weight of the composition taken as 100% by weight. The composition will preferably comprise a solids content of from about 0.5% to about 20% by weight solids, preferably from about 0.5% to about 10% by weight solids, and even more preferably from about 1% to about 10% by weight solids, based upon the total weight of the composition taken as 100% by weight.

Any additional ingredients are also preferably dispersed in the solvent system along with the polymer. For example, the preferred photosensitive compositions also contain a catalyst. The preferred catalyst is an acid generator, and particularly a photoacid generator ("PAG"; both ionic and/or non-ionic). Any PAG that produces an acid in the presence of radiation is suitable. Preferred PAGs are selected from the group consisting of oxime-sulfonates (e.g., those sold under the name CGI® by CIBA), bis(4-tert-butylphenyl) iodonium salts (e.g., BBI-106, by Midori Kagaku Co. Ltd.), and mixtures thereof. The compositions preferably comprise from about 0.1% to about 2% by weight catalyst, preferably from about 0.1% to about 1% by weight catalyst, and even more preferably from about 0.1% to about 0.5% by weight catalyst, based upon the total weight of the composition taken as 100% by weight.

The compositions can also include a light attenuating moiety. Suitable light attenuating moieties include those selected from the group consisting of trimethylol ethoxylate, 4-hydroxybenzaldehyde, and 2-cyano-3-(4-hydroxyphenyl)-acrylic acid ethyl ester. When present, the compositions preferably comprise from about 0.01% to about 1% by weight light attenuating moiety, preferably from about 0.05% to about 0.5% by weight, and even more preferably from about 0.1% to about 0.5% by weight, based upon the total weight of the composition taken as 100% by weight. Additional ingredients that may be included in the composition include surfactants, adhesion promoters, antioxidants, photoinitiators, and combinations of the foregoing.

EXAMPLES

The following examples set forth preferred methods in accordance with the invention. It is to be understood, however, that these examples are provided by way of illustration and nothing therein should be taken as a limitation upon the overall scope of the invention.

Example 1

Hardmask Formulation I

In this procedure a developer-soluble hardmask was formulated using the ingredients from Table 1. The ingredients were added to a flask in the order listed below and mixed under agitation. The mixture was filtered through a 0.1-micron membrane to remove particles. The formulation was then spin-coated onto a silicon wafer at 2,000 rpm for 40 seconds, followed by a two-stage bake at 120° C. for 40 seconds and then at 200° C. for 60 seconds. The thickness of the resulting film was measured to be about 75 nm±5 nm. The index of refraction of the film was measured to be about 1.6±0.05 at 193 nm, about 1.8±0.05 at 248 nm, and about 1.7±0.05 at 365 nm. The extinction coefficient of the film was measured to be about 0.38±0.05 at 193 nm, about 0.39±0.05 at 248 nm, and 0.42±0.05 at 365 nm.

The wafer was then immersed in TMAH while the analyzer measured the rate at which the film was removed. This film's dissolution rate in 0.26N TMAH was measured to be about 3 nm/second±1 nm/second.

TABLE 1

| Hardmask Formulation I | |
|---|---|
| Ingredient | Weight %[A] |
| Propyleneglycolpropyl ether[1] | 90.3 |
| Titanium Acetylacetonate[2] | 6.5 |
| Cymel ® 303LF[3] | 1.7 |
| 2-cyano-3-(4-hydroxyphenyl)-acrylic acid ethyl ester[4] | 1.5 |

[A]Based upon the total weight of the formulation taken as 100% by weight.
[1]General Chemical Corp., Parsippany, NJ.
[2]Tyzor ® AA-105, DuPont.
[3]Cytec Industries, West Paterson, NJ.
[4]St-Jean Photochemicals, Quebec, Canada.

Example 2

Vias Created on Hardmask I by Double Exposure-Development

In this Example, a film stack was prepared using hardmask formulation I from Example 1. The developer-soluble hardmask was spin-coated onto a silicon substrate (100-mm wafer) at 2,000 rpm for 40 seconds, followed by a two-step thermal curing process. In particular, the wafer was heated at 120° C. for 40 seconds and then at 200° C. for 60 seconds on a hotplate. The thermally-set, developer-soluble hardmask formed a film having a thickness of 75 nm.

A commercial photoresist for i-line (365-nm) photolithography (SPR-950, from Rohm and Haas) was diluted with 2-heptanone to one-fifth of the original solids content. The diluted photoresist was spin-applied onto the hardmask to form an imaging layer. The wafer was then baked at 90° C. for 60 seconds as a post-application bake ("PAB"). The imaging layer had a thickness of 80 nm.

Next, the wafer was exposed with a photomask on a GCA Model 3300™ stepper NA=0.43) to radiation having a wavelength of 365 nm, followed by PEB at 110° C. for 60 seconds. The wafer was then developed by immersing in 0.26N TMAH for 40 seconds to remove the exposed portions of the imaging layer and hardmask. The imaging layer was then removed by puddling PGME (Harcross, St. Louis, Mo.), onto the wafer for 20 seconds. The wafer was then rinsed with PGME and spun dry. The imaging layer was completely removed from the wafer by this puddling process. The vias formed by the exposure process remained in the hardmask.

Figure 3:
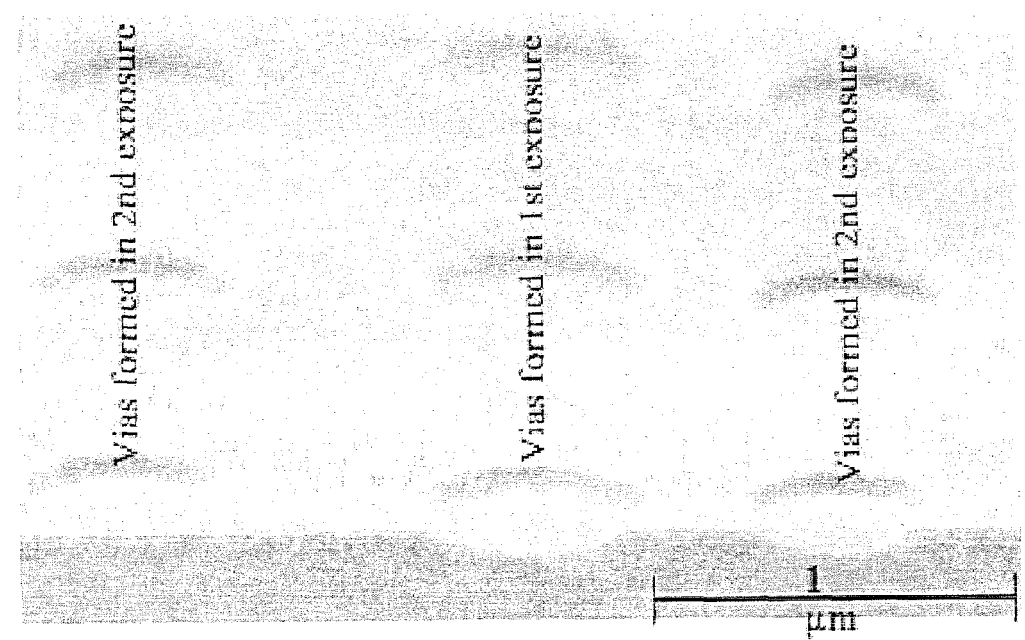
FIG. 3 is an SEM image of vias formed on the hardmask by the double exposure process of Example 2.

The diluted photoresist was again applied on the patterned hardmask. The wafer was baked at 90° C. for 60 seconds as a PAB. Then the wafer was exposed on the same GCA Model 3300 stepper with the photomask slightly shifted from the first exposure process. The PEB was carried out at 110° C. for 60 seconds. The wafer was then developed with 0.26N TMAH for 40 seconds. The imaging layer was then stripped using an organic solvent (PGME) as described above. The via patterns on the hardmask created by the dual exposure-development process are shown in FIG. 3, as an SEM image.

Example 3

Synthesis of Silicon-Containing Polymer for Hardmask Formulation II

In this procedure, 2 grams of styrene (Aldrich, Milwaukee, Wis.), 5.6 grams of methacrylic acid (Aldrich, Milwaukee, Wis.), and 12.4 grams of methacryloxymethyltrimethylsilane (Gelest, Morrisville, Pa.) were dissolved in 180 grams of PGME in a 3-neck round-bottom flask. The flask was degassed with dry nitrogen for 10-20 minutes. Next, 1 gram of azobisisobutyronitrile (AIBN, Aldrich, Milwaukee, Wis.) as a catalyst was added, and the mixture was stirred at room temperature until the catalyst completely dissolved. The flask with was then immersed into a preheated oil bath of 80° C. Nitrogen was introduced to the flask at a rate of about 5 mL/min. A condenser with water cooling was fitted into the center neck of the flask for refluxing. After 16 hours of reaction under constant stirring, the flask was removed from the oil bath and cooled down in the air to room temperature.

The contents of the flask were then slowly poured into excessively cold (20° C.-25° C.) hexanes (Aldrich, Milwaukee, Wis.). A precipitate formed in the hexanes. The precipitate was filtered out and washed thoroughly with additional hexanes to yield a fine white power. The resulting terpolymer was characterized by gel permission chromatography (GPC), as having a Mw of 7,100 Daltons with a polydispersity of 1.48.

Example 4

Hardmask Formulation II

In this Example, a hardmask formulation was prepared using the polymer synthesized in Example 3. The ingredients were added to a flask in the order listed in Table 2 below and mixed under agitation until homogenous. The solution was then filtered through a 0.1-μm endpoint filter. Next, the formulation was spin-coated onto a silicon wafer at 1,500 rpm for 40 seconds, followed by baking at 160° C. for 60 seconds. The thickness of the resulting hardmask film was measured to be about 60 nm. The optical indices of the film were measured using a variable angle spectrometric ellipsometer (VASE; J. A. Woollam Co., Inc.). The index of refraction of the film was measured to be about 1.6 at 193 n. The extinction coefficient of the film was measured to be about 0.10 at 193 nm.

TABLE 2

Hardmask Formulation II

| Ingredient | Weight %[4] |
|---|---|
| Propyleneglycolpropyl ether[1] | 98.5 |
| Polymer from Example 3 | 1.42 |
| 1,3,5-tris[4-(vinyloxy)butyl]trimesate[2] | 0.332 |
| CGI TPS-C1[3] | 0.0226 |
| tert-Butyl-4-hydroxy-1-piperidinecarboxylate[4] | 0.0034 |

[4]Based upon the total weight of the formulation taken as 100% by weight.
[1]General Chemical Corp., Parsippany, NJ.
[2]In-house synthesized vinyl ether crosslinking agent, Brewer Science, Rolla, MO.
[3]Ciba, Tarrytown, NY.
[4]Aldrich, Milwaukee, WI.

Solvent resistance tests were then performed on the cured hardmask film. Hardmask formulation II was spin-coated onto a silicon wafer at 1,500 rpm for 40 seconds, followed by baking at 160° C. for 60 seconds. The initial thickness of the resulting film was measured and recorded. Then a solvent was puddled onto the film for 20 seconds, followed by spin drying at about 2,000-3,500 rpm for about 20-30 seconds to remove the solvent. The thickness was measured again and recorded. Table 3 below shows that hardmask formulation II had good solvent resistance for various solvents.

TABLE 3

Hardmask Formulation II Solvent Resistance

| Solvent | Initial Thickness (nm) | Thickness after 20 s rinse (nm) | % strip |
|---|---|---|---|
| PGME | 51.4 | 52.3 | −1.75% |
| Ethyl lactate | 51.0 | 54.3 | −6.5% |
| PGMEA | 51.4 | 51.3 | 0.195% |
| Cyclohexanone | 53.6 | 55.3 | −3.17% |
| Acetone | 52.7 | 53.2 | −0.95% |

Example 5

Trenches and Lines Created with Hardmask II by Single Exposure-Development

Figure 4:
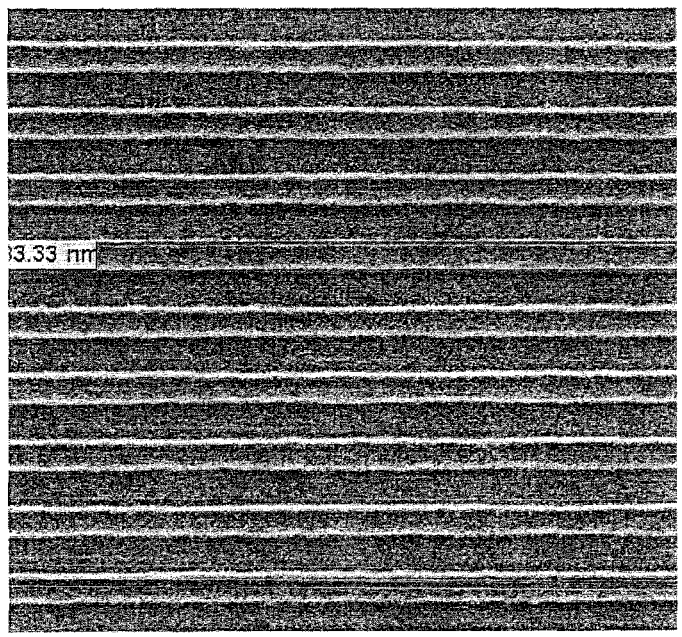
FIG. 4 shows an SEM image of the trenches and lines formed in the imaging layer and hardmask II from Example 5.

In this procedure, a film stack was prepared using hardmask formulation II described in Example 4 above. First, an intermediate layer was spin-applied onto a silicon wafer. The intermediate layer was an antireflective coating (OptiStack™ SoC110D, from Brewer Science Inc.). The intermediate layer was baked at 205° C. for 60 seconds. The intermediate layer had a thickness of 320 nm, refractive index of 1.42, and extinction coefficient of 0.52 at 193 nm. Hardmask formulation II was then spin-coated at 1500 rpm on top of the intermediate layer, and baked at 160° C. for 60 seconds. An imaging layer was then applied on top of the hardmask. The imaging layer was a commercially-available photoresist (TArF Pi-6001, TOK). Next, the wafer was exposed on an ASML 1700i scanner, followed by PEB at 110° C. for 60 seconds. The stack was then developed by immersing in 0.26 N TMAH developer. The imaging layer together with the hardmask was patterned with 80-nm trenches and lines. The patterns are shown FIG. 4 as an SEM image.

Example 6

Synthesis of Silicon-Containing Polymer for Hardmask Formulation III

In this Example, a polymer mother liquor for hardmask formulation ITT was prepared by mixing, in a 3-neck round-bottom flask, 2.8 grams of methacrylic acid (Aldrich, Milwaukee, Wis.), 7.2 grams of methacryloxymethyltrimethylsilane (Gelest, Morrisville, Pa.), and 90 grams of PGME. The flask was then degassed with Dry nitrogen for 10-20 minutes. Next, 0.5 grams of azobisisobutyronitrile as a catalyst were added, and the mixture was stirred at room temperature until the catalyst completely dissolved. The flask was then immersed into a preheated oil bath of 75° C., and nitrogen was introduced into the flask at the rate of about 5 mL/min. A condenser with water cooling was fitted into the center neck of the flask for refluxing. After 16 hours of reaction under constant stirring, the flask was removed from the oil bath and cooled down in the air to room temperature. The molecular weight of the resulting copolymer was determined by GPC to be 12,600 Daltons. No purification was performed. The contents of the flask were used as the polymer mother liquor for the hardmask formulation.

Example 7

Hardmask Formulation III

In this Example, a hardmask formulation was prepared using the polymer mother liquor synthesized in Example 6. The ingredients were added to a flask in the order listed in Table 4 below and mixed under agitation until homogenous. The solution was filtered through a 0.1-μm endpoint filter. The formulation was spin-coated onto a silicon wafer and baked at 160° C. for 60 seconds. The resulting film thickness was measured to be about 65 nm. The optical indices of the hardmask film were measured on a variable angle spectrometric ellipsometer (J. A. Woollam Co., Inc.). The refractive index was determined to be 1.60 at 193 nm. The extinction coefficient of the film was measured to be about 0.05 at 193 mm.

TABLE 4

| Hardmask Formulation III | |
|---|---|
| Ingredients | Weight %[A] |
| Propyleneglycolpropyl ether[1] | 86.5 |
| Polymer mother liquor from Example 6 | 13.18 |
| 1,3,5-tris[4-(vinyloxy)butyl]trimesate[2] | 0.26 |
| CGI TPS-C1[3] | 0.023 |
| BBI-106[4] | 0.037 |

[A]Based upon the total weight of the formulation taken as 100% by weight.
[1]General Chemical Corp., Parsippany, NJ.
[2]In-house synthesized vinyl ether crosslinking agent, Brewer Science, Rolla, MO.
[3]Ciba, Tarrytown, NY.
[4]Midori Kagaku, Japan.

Example 8

Synthesis of Silicon-Containing Polymer for Hardmask Formulation IV

In this procedure, a polymer mother liquor was prepared by mixing, in a 3-neck round-bottom flask, 0.944 grams of styrene (Aldrich, Milwaukee, Wis.), 3.47 grams of methacrylic acid (Aldrich, Milwaukee, Wis.), 5.586 grams of POSS-methacrylate (Hybride Plastics, Fountain Valley, Calif.), and 90 grams of PGME. The flask was then degassed with dry nitrogen for about 10-20 minutes. Next, 0.6 grams of azobisisobutyronitrile were added to the flask as a catalyst. Mixing continued under constant stirring at room temperature until the catalyst completely dissolved. The flask was then immersed into a preheated oil bath of 70° C., and nitrogen was introduced to the flask at the rate of about 5 mL/min. A condenser with water cooling was fitted into the center neck of the flask for refluxing. After 15 hours of reaction under constant stirring, the flask was taken out of the oil bath and cooled down in the air to room temperature. The molecular weight of the polymer was determined by GPC to be 9,260 Daltons with a polydispersity of 1.7. No purification was performed. The contents of the flask were used as the mother liquor for hardmask formulation IV.

Example 9

Hardmask Formulation IV

In this Example, hardmask formulation IV was prepared using the polymer mother liquor from Example 8 above. The ingredients were added to a flask in the order listed in Table 5 below and mixed under agitation until homogenous. The solution was filtered through a 0.1-μm endpoint filter. The formulation was spin-coated onto a silicon wafer at 1,500 rpm and baked at 160° C. for 60 seconds. The resulting film thickness was measured to be about 65 nm. The optical indices of the hardmask film were measured on a variable angle spectrometric ellipsometer. The refractive index was determined to be 1.60 at 193 nm. The extinction coefficient of the film was measured to be about 0.15 at 193 nm.

TABLE 5

| Hardmask formulation IV | |
|---|---|
| Ingredients | Weight %[A] |
| Propyleneglycolpropyl ether[1] | 87.9 |
| Polymer mother liquor from Example 8 | 11.73 |
| 1,3,5-tris[4-(vinyloxy)butyl]trimesate[2] | 0.342 |

TABLE 5-continued

Hardmask formulation IV

| Ingredients | Weight %[A] |
|---|---|
| CGI TPS-C1[3] | 0.0219 |
| tert-Butyl-4-hydroxy-1-piperidinecarboxylate[4] | 0.0061 |

[A]Approximate weight based upon the total weight of the formulation taken as 100% by weight.
[1]General Chemical Corp., Parsippany, NJ.
[2]In-house synthesized vinyl ether crosslinking agent, Brewer Science, Rolla, MO.
[3]Ciba, Tarrytown, NY.
[4]Aldrich, Milwaukee, WI.

Example 10

Trenches and Lines Created with Hardmask IV by Single Exposure-Development

Figure 5:
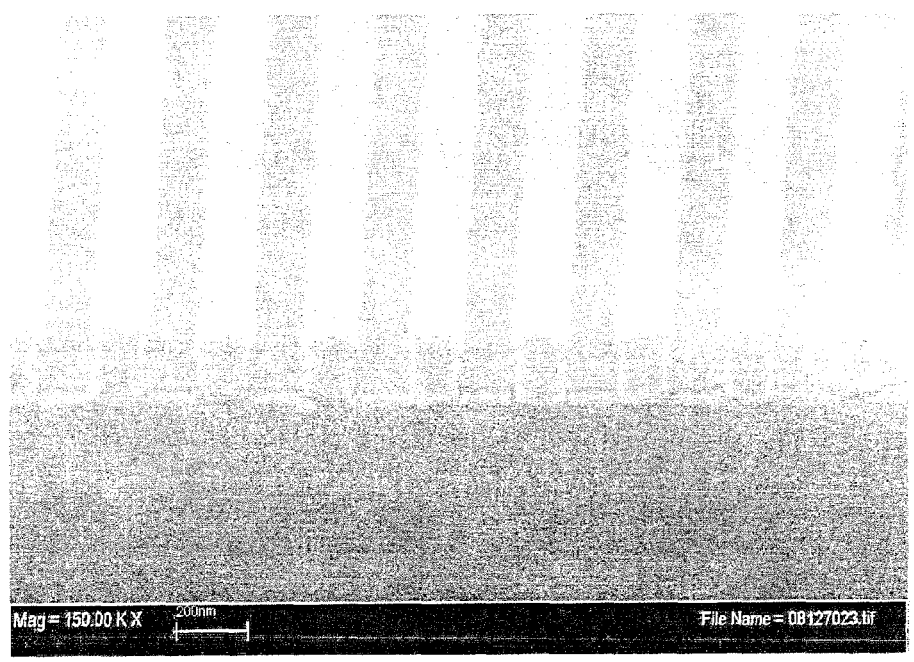
FIG. 5 shows an SEM image of the trenches and lines formed in the imaging layer and hardmask IV from Example 10.

In this procedure, a film stack was prepared using hardmask formulation IV described in Example 9 above. First, an intermediate layer was spin-applied onto a silicon wafer. The intermediate layer was an antireflective coating (OptiStack™ SoC110D). The intermediate layer was baked at 205° C. for 60 seconds. The layer had a thickness of 320 nm, refractive index of 1.42 at 193 nm, and extinction coefficient of 0.52 at 193 nm. Hardmask formulation IV was then spin-coated at 1,500 rpm on top of the intermediate layer, and baked at 160° C. for 60 seconds. Next, an imaging layer was applied on top of the hardmask. The imaging layer was a commercially-available photoresist (AM2073J, TOK). The wafer was then exposed using an immersion lithography microstepper from Amphibian™ Systems (Rochester, N.Y.), followed by PEB at 120° C. for 60 seconds. The wafer stack was then developed by immersing in 0.26 N TMAH developer. The photoresist together with the hardmask was patterned with 150-nm trenches and lines. The patterns are shown FIG. 5 as an SEM image.

Example 11

Crosslinker Formulation

In this Example, the in-house vinyl ether crosslinker used in Examples 4, 7, and 9 was prepared by adding 25.15 grams of tetramethylene glycol monovinyl ether (Aldrich, St Louis, Mo.), 22.91 grams of triethylamine (Aldrich, St Louis, Mo.), and 250 ml tetrahydrofuran ("THF"; Aldrich, St. Louis, Mo.) to a 500-ml, 2-neck flask. The flask was equipped with a stir bar, addition funnel, condenser, and nitrogen inlet and outlet. The flask was immersed in an ice water bath and the solution was stirred under a flow of nitrogen.

Next, 20.00 grams of 1,3,5-benzenetricarbonyl trichloride (Aldrich, St. Louis, Mo.) were dissolved in 50 ml THF in a 250-ml Erlenmeyer flask. This solution was transferred to the addition funnel on the 500-ml 2-neck flask and added dropwise to the stirring 2-(vinyloxy)ethanol/triethylamine/THF solution for about 15 minutes, until the addition was completed. A white precipitate formed on contact. The flask was then removed from the ice bath and the slurry was allowed to come to room temperature in the flask, which took approximately 16 hours. The slurry was then heated to reflux for 4 hours. The flask was removed from the heat and allowed to cool to room temperature. The slurry was then filtered using a suction filtration setup, and concentrated using a rotary evaporator to give a viscous yellow liquid.

This liquid was dissolved in 100 ml of diethylether (Aldrich, St. Louis, Mo.) and washed twice with 25-ml portions of aqueous, 12.5% tetramethylammonium hydroxide (TMAH; Aldrich, St. Louis, Mo.). The ether layer was extracted using a separatory funnel and then washed twice using 50-ml portions of deionized water. The ether layer was allowed to settle out and collected. The ether layer was dried by mixing with 5.0 g of activated basic alumina. The mixture was stirred for 1 hour and gravity filtered. The clear yellow liquid was concentrated in a rotavap to give a yellow viscous oil. Total yield was approximately 29.28 grams (77% yield).

We claim:

1. A method of forming a microelectronic structure, said method comprising:
   (a) providing a substrate having a surface;
   (b) applying a hardmask composition adjacent the substrate surface, said hardmask composition comprising a polymer dispersed or dissolved in a solvent system, said polymer comprising recurring monomers of

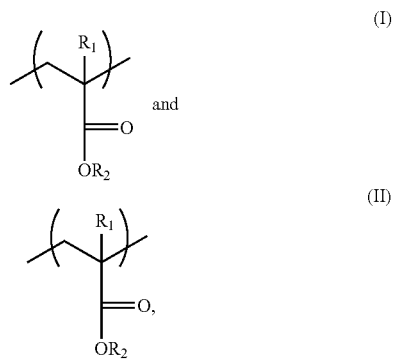

where:
   each $R_1$ is individually selected from the group consisting of —H, and alkyl groups; and
   each $R_2$ is individually selected from the group consisting of —H, and silicon-containing moieties selected from the group consisting of

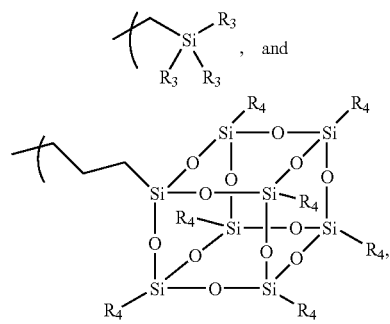

where each $R_3$ is selected from the group consisting of alkyl groups, and each $R_4$ is selected from the group consisting of n-butyl, t-butyl, and alkyl groups, and wherein at least one of said $R_2$ is a silicon-containing moiety;
   (c) baking said hardmask composition to yield a hardmask layer;
   (d) applying a photosensitive composition to form a first imaging layer on top of said hardmask layer;

(e) exposing said first imaging layer to activating radiation to yield exposed portions in said first imaging layer;

(f) contacting said first imaging layer with a developer so as to remove said exposed portions of said first imaging layer, wherein said contacting also results in the removal of portions of said hardmask layer beneath said exposed portions in said first imaging layer, yielding a patterned hardmask layer;

(g) contacting said first imaging layer with an organic solvent so as to remove said first imaging layer; and (h) applying a second photosensitive composition to form a second imaging layer on top of said patterned hardmask layer, without applying additional hardmask composition to said substrate.

2. The method of claim 1, further comprising the step of applying an intermediate layer to said substrate prior to applying said hardmask layer.

3. The method of claim 1, said wherein no dry etching occurs during (a)-(h).

4. The method of claim 1, wherein the pattern of said patterned hardmask layer remains intact during (g).

5. The method of claim 1, wherein said first imaging layer is a photoresist.

6. The method of claim 1, wherein said first imaging layer has a thickness of from about 20 nm to about 200 nm.

7. The method of claim 1, wherein said hardmask composition is thermally crosslinked during (c) yielding a cured hardmask layer.

8. The method of claim 1, said hardmask layer having an initial solubility in a base developer, wherein:
 said exposing (e) further comprises exposing at least a portion of said hardmask layer to activating radiation to yield exposed portions of said hardmask layer, said exposed portions of said hardmask layer having a final solubility in base developer, said final solubility being greater than said initial solubility.

9. The method of claim 1, further comprising:
 (i) exposing said second imaging layer to activating radiation to yield exposed portions in said second imaging layer;
 (j) contacting said second imaging layer with a developer so as to remove said exposed portions, wherein said contacting also results in the removal of portions of said hardmask layer beneath said exposed portions in said second imaging layer, yielding a further patterned hardmask layer; and
 (k) contacting said second imaging layer with an organic solvent so as to remove said second imaging layer.

10. The method of claim 9, wherein the pattern of the patterned hardmask layer formed in (j) remains intact during (k).

11. The method of claim 9, wherein no dry etching occurs during (a)-(k).

12. The method of claim 9, further comprising:
 (l) transferring the pattern of the patterned hardmask layer formed in (j) to the substrate.

13. The method of claim 12, wherein (l) comprises etching said patterned hardmask layer and substrate.

14. The method of claim 12, wherein the pattern of said patterned hardmask layer comprises vias and trenches.

* * * * *